US010672908B2

(12) United States Patent
Chang et al.

(10) Patent No.: US 10,672,908 B2
(45) Date of Patent: Jun. 2, 2020

(54) FIN FIELD EFFECT TRANSISTOR

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/207,218

(22) Filed: Dec. 3, 2018

(65) Prior Publication Data

US 2019/0115472 A1 Apr. 18, 2019

Related U.S. Application Data

(63) Continuation of application No. 15/715,153, filed on Sep. 25, 2017, now Pat. No. 10,147,821, which is a continuation of application No. 14/968,906, filed on Dec. 15, 2015, now Pat. No. 9,793,407.

(51) Int. Cl.
*H01L 29/78* (2006.01)
*H01L 29/66* (2006.01)
*H01L 29/06* (2006.01)

(52) U.S. Cl.
CPC ...... *H01L 29/7851* (2013.01); *H01L 29/0653* (2013.01); *H01L 29/66545* (2013.01); *H01L 29/785* (2013.01)

(58) Field of Classification Search
None
See application file for complete search history.

(56) References Cited

U.S. PATENT DOCUMENTS

2015/0021672 A1  1/2015  Chuang et al.
2016/0284799 A1* 9/2016  Yoon ................... H01L 29/0653
2016/0336183 A1* 11/2016  Yuan ................. H01L 29/66795

FOREIGN PATENT DOCUMENTS

TW          201501240         1/2015

OTHER PUBLICATIONS

"Office Action of Taiwan Counterpart Application," dated Feb. 24, 2020, p. 1-p. 7.

* cited by examiner

*Primary Examiner* — Ali Naraghi
(74) *Attorney, Agent, or Firm* — JCIPRNET

(57) ABSTRACT

A substrate is patterned to form trenches and a semiconductor fin between the trenches. Insulators are formed in the trenches and a dielectric layer is formed to cover the semiconductor fin and the insulators. A dummy gate strip is formed on the dielectric layer. Spacers are formed on sidewalls of the dummy gate strip. The dummy gate strip and the dielectric layer underneath are removed until sidewalls of the spacers, a portion of the semiconductor fin and portions of the insulators are exposed. A second dielectric layer is selectively formed to cover the exposed portion of the semiconductor fin, wherein a thickness of the dielectric layer is smaller than a thickness of the second dielectric layer. A gate is formed between the spacers to cover the second dielectric layer, the sidewalls of the spacers and the exposed portions of the insulators.

19 Claims, 12 Drawing Sheets

FIN FIELD EFFECT TRANSISTOR

CROSS-REFERENCE TO RELATED APPLICATION

This is a continuation application of and claims the priority benefit of U.S. application Ser. No. 15/715,153, filed on Sep. 9, 2017, now allowed, which is a continuation application of and claims the priority benefit of U.S. application Ser. No. 14/968,906, filed on Dec. 15, 2015, U.S. Pat. No. 9,793,407, issued on Oct. 17, 2017. The entirety of the above-mentioned patent application is hereby incorporated by reference herein and made a part of this specification.

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, the fabricated gate contact for the FinFET may lead high Resistive-Capacitive (RC) delay. Accordingly, gate contact with high RC delay may impact yield rate and reliability of the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
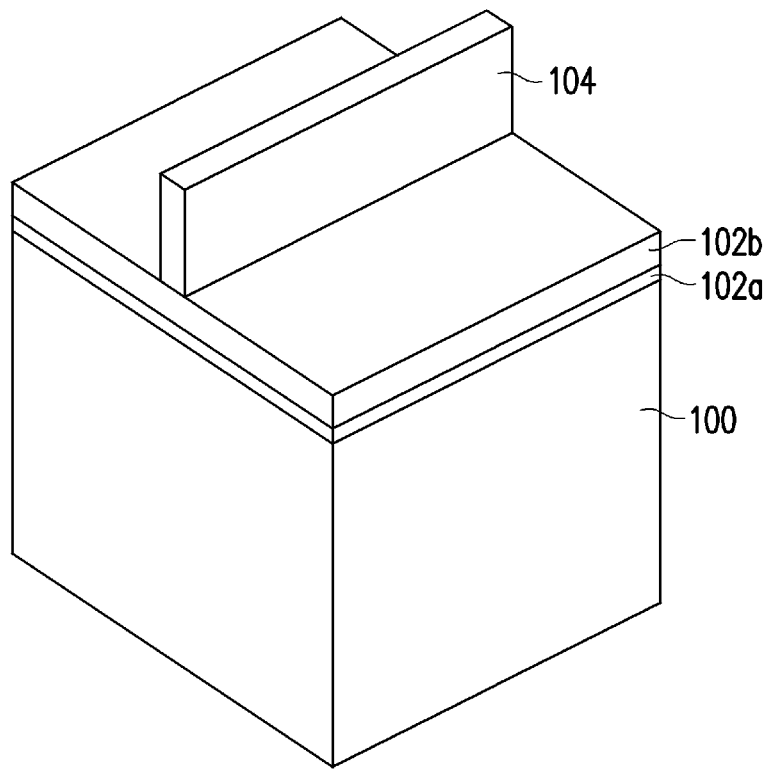
FIGS. 1A-1K are perspective views of a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a FinFET. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIG. 1A is a perspective view of the semiconductor device at one of various stages of the manufacturing method. Referring to FIG. 1A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 102a and a mask layer 102b are sequentially formed on the substrate 100. The pad layer 102a may be a silicon oxide thin film formed, for example, by thermal oxidation process. The pad layer 102a may act as an adhesion layer between the substrate 100 and mask layer 102b. The pad layer 102a may also act as an etch stop layer for etching the mask layer 102b. In at least one embodiment, the mask layer 102b is a silicon nitride layer formed, for example, by low-pressure chemical vapor deposition (LPCVD) or plasma enhanced chemical vapor deposition (PECVD). The mask layer 102b is used as a hard mask during subsequent photolithography processes. Then, a patterned photoresist layer 104 having a predetermined pattern is formed on the mask layer 102b.

Figure 1B:
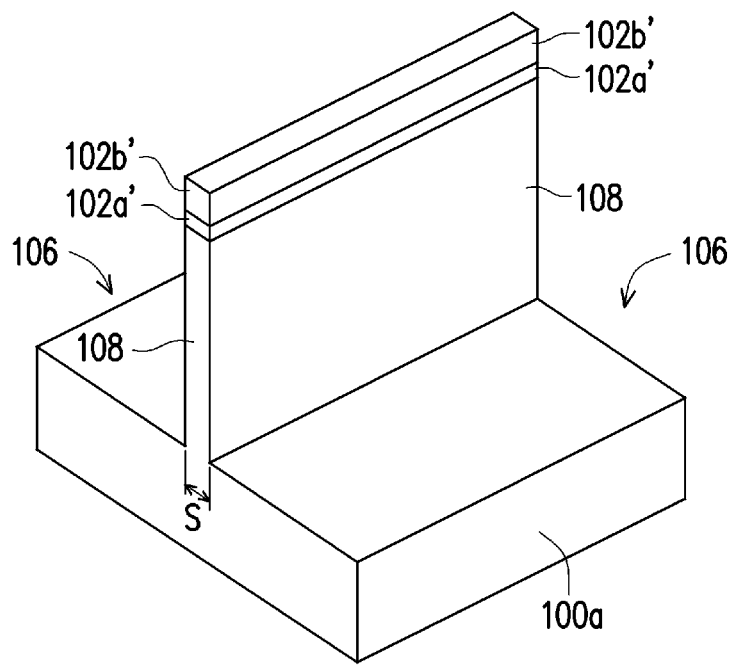

FIG. 1B is a perspective view of the semiconductor device at one of various stages of the manufacturing method. Referring to FIGS. 1A-1B, the mask layer 102b and the pad layer 102a which are not covered by the patterned photoresist layer 104 are sequentially etched to form a patterned mask layer 102b' and a patterned pad layer 102a' so as to expose underlying substrate 100. By using the patterned mask layer 102b', the patterned pad layer 102a' and the patterned photoresist layer 104 as a mask, portions of the substrate 100 are exposed and etched to form trenches 106 and at least one semiconductor fin 108. The number of the semiconductor fin 108 shown in FIG. 1A is merely for illustration, in some alternative embodiments, two or more parallel semiconductor fins may be formed in accordance with actual design requirements. After the substrate 100 is patterned, the semiconductor fin 108 is covered by the patterned mask layer 102b', the patterned pad layer 102a' and the patterned photoresist layer 104. Two adjacent trenches 106 are spaced apart by a spacing S. For example, the spacing S between trenches 106 may be smaller than about 30 nm. In other words, two adjacent trenches 106 are spaced from each other by the semiconductor fin 108.

The height of the semiconductor fin 108 and the depth of the trench 106 range from about 5 nm to about 500 nm. After the trenches 106 and the semiconductor fin 108 are formed, the patterned photoresist layer 104 is then removed. In one embodiment, a cleaning process may be performed to remove a native oxide of the semiconductor substrate 100a and the semiconductor fin 108. The cleaning process may be performed using diluted hydrofluoric (DHF) acid or other suitable cleaning solutions.

Figure 1C:
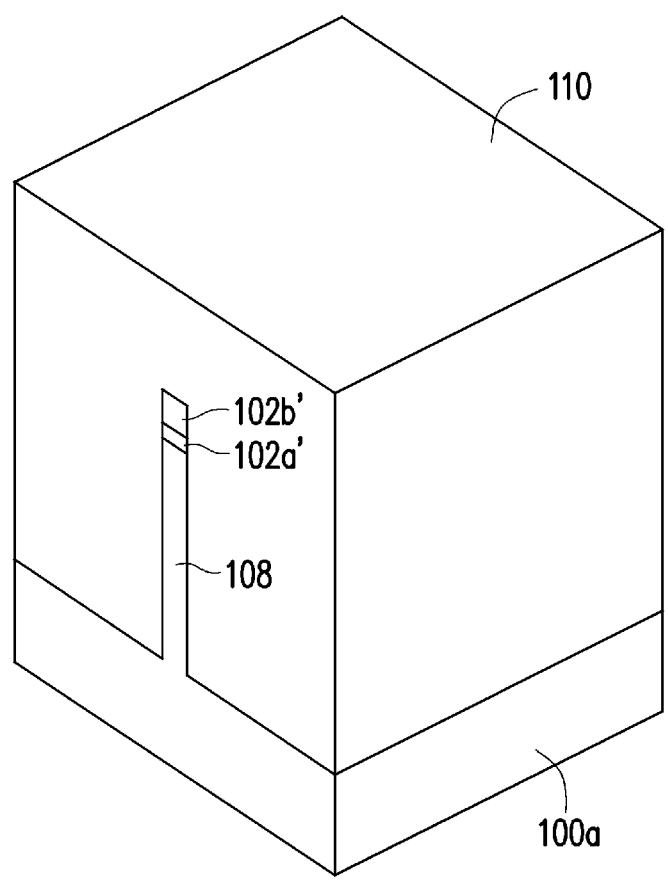

FIG. 1C is a perspective view of the semiconductor device at one of various stages of the manufacturing method. Referring to FIGS. 1B-1C, an insulating material 110 are formed over the substrate 100a to cover the semiconductor fin 108 and fill up the trenches 106. In addition to the semiconductor fin 108, the insulating material 110 further covers the patterned pad layer 102a' and the patterned mask layer 102b'. The insulating material 110 may include silicon oxide, silicon nitride, silicon oxynitride, a spin-on dielectric material, or a low-K dielectric material. The insulating material 110 may be formed by high-density-plasma chemical vapor deposition (HDP-CVD), sub-atmospheric CVD (SACVD) or by spin-on.

Figure 1D:
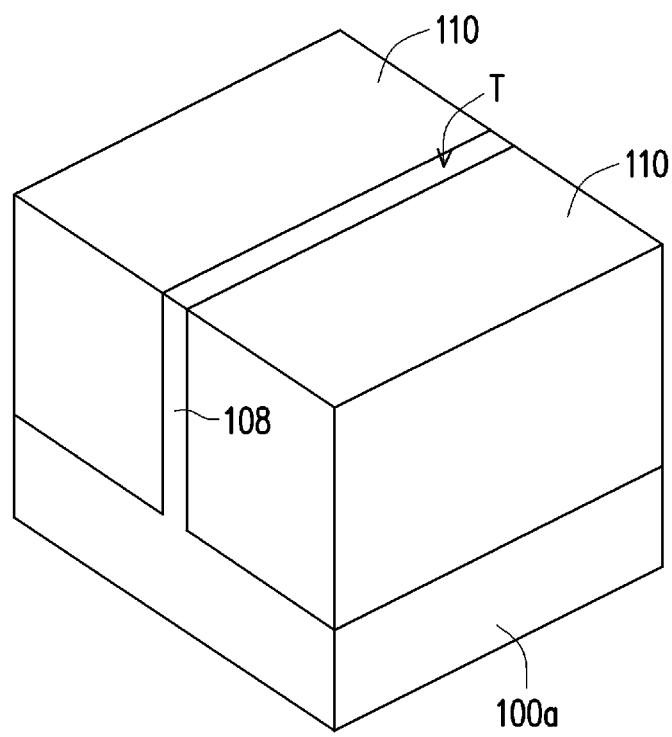

FIG. 1D is a perspective view of the semiconductor device at one of various stages of the manufacturing method. Referring to FIGS. 1C-1D, a chemical mechanical polish process is, for example, performed to remove a portion of the insulating material 110, the patterned mask layer 102b' and the patterned pad layer 102a' until the semiconductor fin 108 is exposed. As shown in FIG. 1D, after the insulating material 110 is polished, a top surface of the polished insulating material 110 is substantially coplanar with a top surface T2 of the semiconductor fin 108.

Figure 1E:
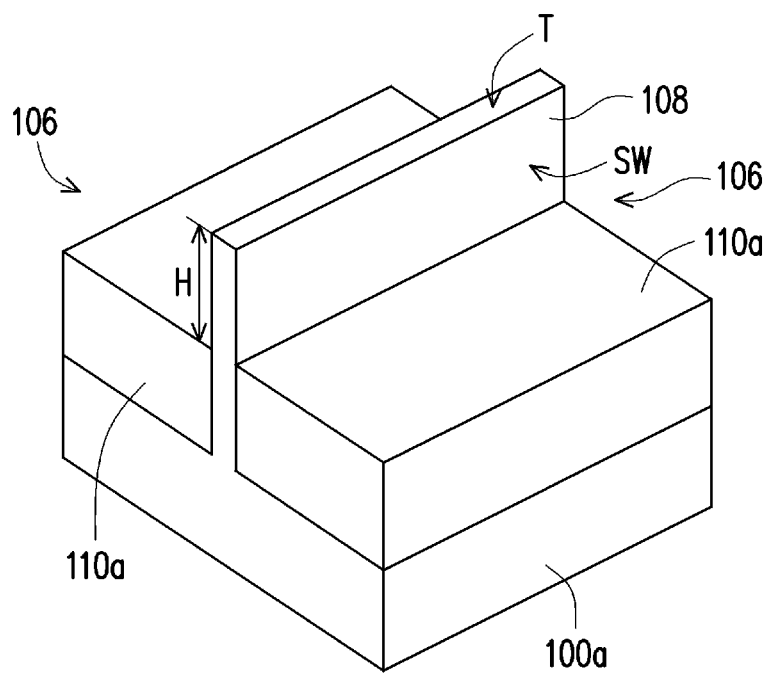

FIG. 1E is a perspective view of the semiconductor device at one of various stages of the manufacturing method. Referring to FIGS. 1D-1E, the polished insulating material 110 filled in the trenches 106 is partially removed by an etching process such that insulators 110a are formed on the substrate 100a and each insulator 110a is located in one of the trenches 106 correspondingly. In one embodiment, the etching process may be a wet etching process with hydrofluoric acid (HF) or a dry etching process. The top surfaces T1 of the insulators 110a are lower than the top surface T2 of the semiconductor fin 108. In other words, the semiconductor fin 108 protrudes from the top surfaces T1 of the insulators 110a and sidewalls SW of the semiconductor fin 108 are thus exposed. The height difference between the top surface T2 of the semiconductor fin 108 and the top surfaces T1 of the insulators 110a is H, and the height difference H ranges from about 15 nm to about 50 nm.

Figure 1F:
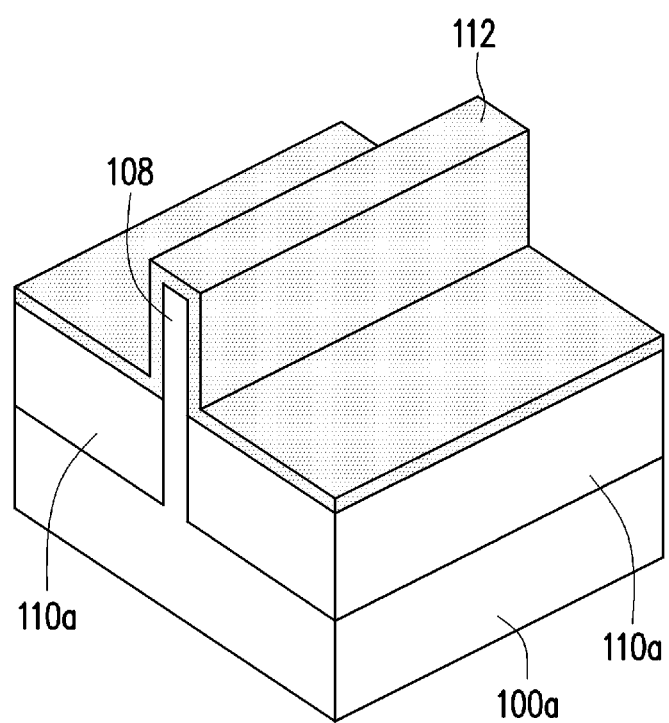

FIG. 1F is a perspective view of the semiconductor device at one of various stages of the manufacturing method. Referring to FIGS. 1E-1F, after the insulators 110a are formed, a gate dielectric layer 112 is formed to conformally cover the top surfaces T1 of the insulators 110a, the top surface T2 of the semiconductor fin 108 and the sidewalls SW of the semiconductor fin 108. In one embodiment, the gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 112 is a high-k dielectric layer with a thickness in the range of about 0.2 nm to 50 nm. The gate dielectric layer 112 may be formed by a suitable process such as atomic layer deposition (ALD), chemical vapor deposition (CVD), physical vapor deposition (PVD), thermal oxidation or UV-ozone oxidation. The gate dielectric layer 112 has good quality to serve as a gate dielectric layer in a FinFET.

Figure 1G:
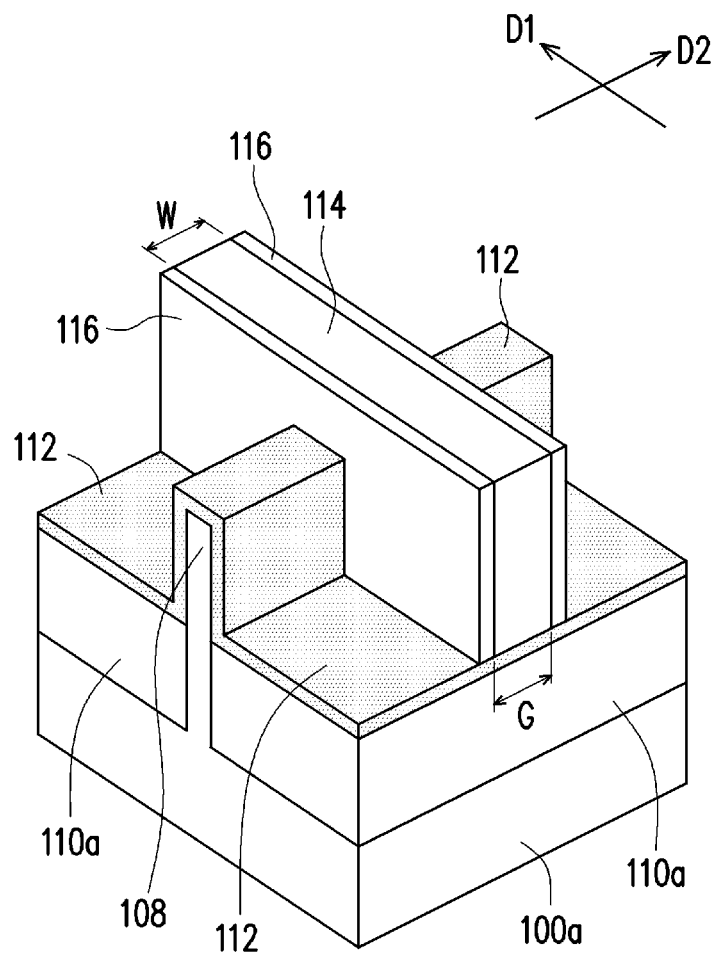

FIG. 1G is a perspective view of the semiconductor device at one of various stages of the manufacturing method. Referring to FIGS. 1F-1G, at least one dummy gate strip 114 is formed on the gate dielectric layer 112, wherein a lengthwise direction D1 of the dummy gate strip 114 is different from a lengthwise direction D2 of the semiconductor fin 108. In some embodiments, the lengthwise direction D1 of the dummy gate strip 114 is perpendicular to the lengthwise direction D2 of the semiconductor fin 108. The number of the dummy gate strip 114 shown in FIG. 1G is merely for illustration, in some alternative embodiments, two or more parallel dummy gate strips may be formed in accordance with actual design requirements. The dummy gate strip 114 includes silicon-containing material, such as poly-silicon, amorphous silicon or a combination thereof. In one embodiment, the width W of the dummy gate strip 114 ranges from is greater than 5 nm. For example, the width W of the dummy gate strip 114 may range from 5 nm to 50 nm (for short channel FinFET) or may be greater than 50 nm (for long channel FinFET).

As shown in FIG. 1G, after the dummy gate strip 114 is formed, a pair of spacers 116 are formed on sidewalls of the dummy gate strip 114. As shown in FIG. 1G, the pair of spacers 116 are formed on the gate dielectric layer 112 and extend along the sidewalls of the dummy gate strip 114. The pair of spacers 116 are formed of dielectric materials, such as silicon nitride or SiCON. The pair of spacers 116 may include a single layer or multilayer structure. Since the pair of spacers 116 are spaced apart by the dummy gate strip 114, a gap G between the pair of spacer 116 substantially equals to the width W of the dummy gate strip 114.

Figure 1H:
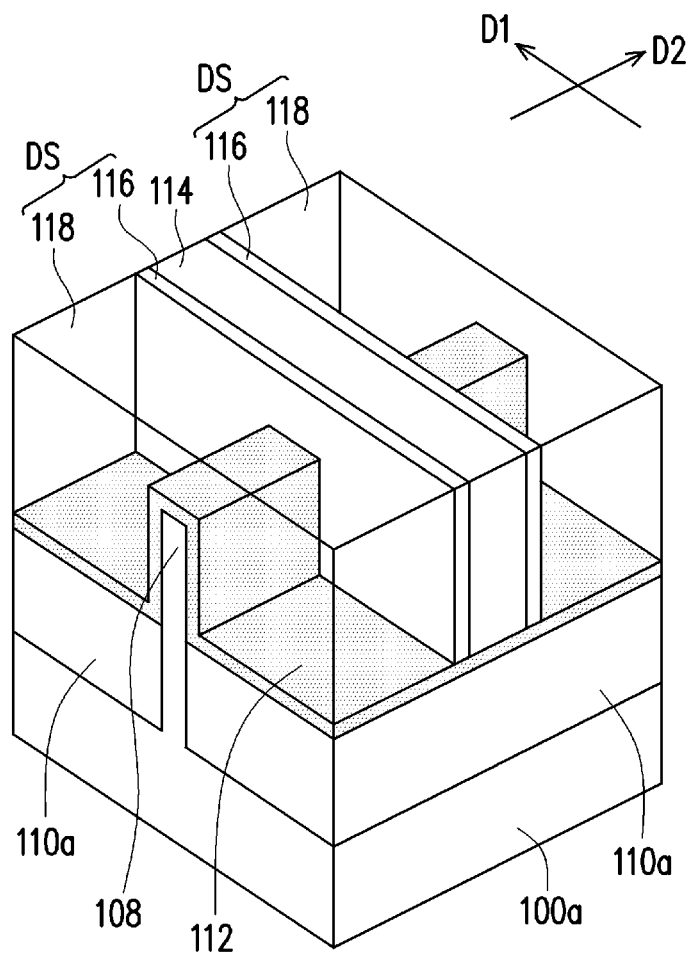

FIG. 1H is a perspective view of the semiconductor device at one of various stages of the manufacturing method. Referring to FIG. 1H, a patterned dielectric layer 118 is formed to cover the gate dielectric layer 112 that are not covered by the dummy gate strip 114 and the spacers 116. A top surface of the patterned dielectric layer 118 is substantially coplanar with the top surface of the dummy gate strip 114. In some embodiments, before the patterned dielectric layer 118 is formed, some processes (e.g., patterning process of gate dielectric layer 112, semiconductor fin recessing process, strained source/drain epitaxial process on the semiconductor fin, silicidation process and so on) may be performed in advance. Details of the aforesaid optional processes are omitted.

As shown in FIG. 1H, in one embodiment, the pair of spacers 116 formed on the sidewalls of the dummy gate strip 114 may be considered as a dielectric structure DS adjacent to the dummy gate strip 114. In an alternative embodiment, the combination of the pair of spacers 116 and the patterned dielectric layer 118 may be considered as a dielectric structure DS adjacent to the dummy gate strip 114. In other words, the dummy gate strip 114 may be embedded in the dielectric structure DS and the dielectric structure DS partially covers the semiconductor fin 108 and the insulators 110a.

Figure 1I:
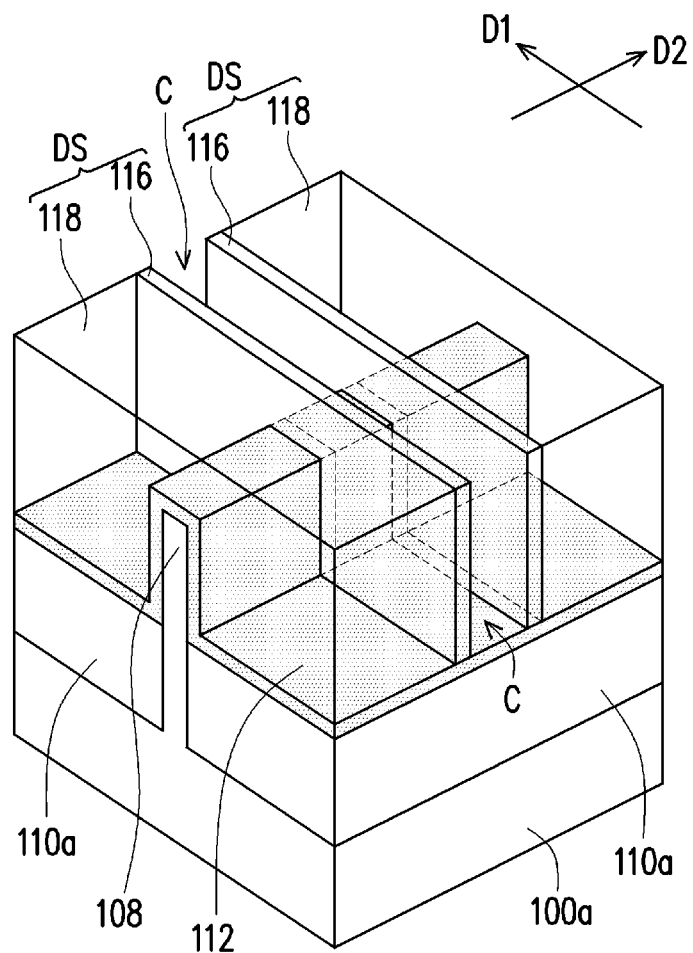

FIG. 1I is a perspective view of the semiconductor device at one of various stages of the manufacturing method. Referring to FIGS. 1H-1I, the dummy gate strip 114 is removed. In one embodiment, the dummy gate strip 114 is removed, for example, by an etching process. Through properly selecting of etchant, the dummy gate strip 114 is removed without damaging the patterned dielectric layers 118, the gate dielectric layer 112 and the spacers 116 significantly. After the dummy gate strip 114 is removed, a cavity C between the pair of spacers 116 is formed. In other words, the dielectric gate layer 112 is partially exposed by the cavity C.

Figure 1J:
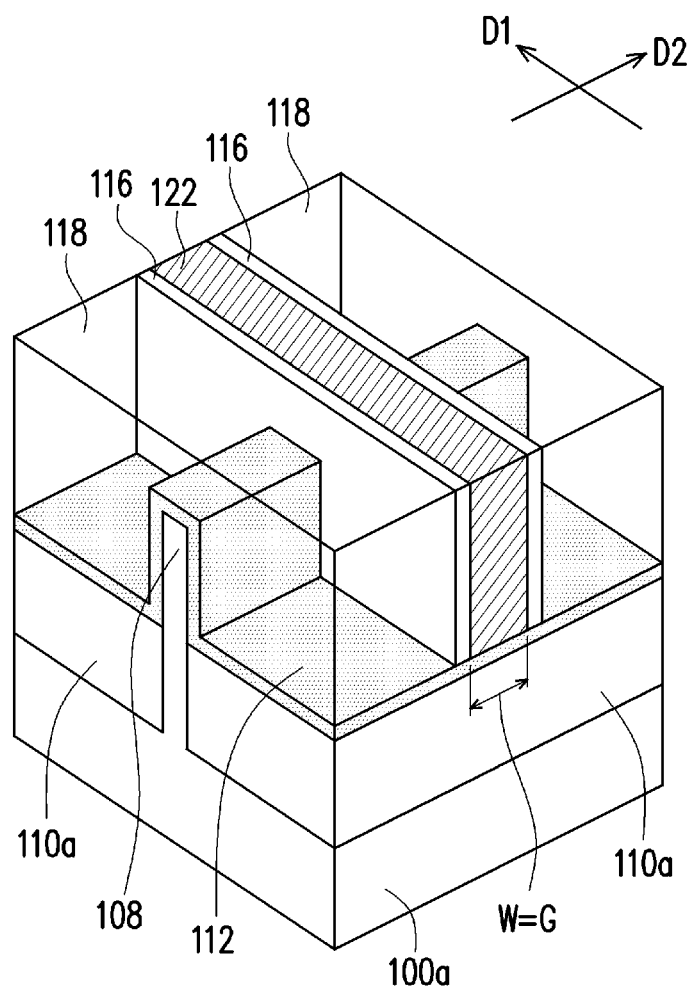

FIG. 1J is a perspective view of the semiconductor device at one of various stages of the manufacturing method. Referring to FIGS. 1I-1J, after the cavity C is formed, a gate 122 is formed in and fills the cavity C and the gate 122 covers the gate dielectric layer 112 exposed by the cavity C. In one embodiment, the width W of the gate 122 may be identical with the width W of the dummy gate strip 114. In some embodiments, the width W of the gate 122 may be greater than 5 nm. For example, the width W of the gate 122 may range from 5 nm to 50 nm (for short channel FinFET) or may be greater than 50 nm (for long channel FinFET). As shown in FIG. 1G and FIG. 1J, the width W of the gate 122, the width W of the dummy gate strip 114 and the gap G1 between the pair of spacer 116 are substantially equal (i.e. W=G). Specifically, the channel length of the FinFET is relevant to the width W of the gate 122. The portion of the semiconductor fin 108 that is overlapped with and covered by the gate 122 serves as a channel of a FinFET. When the channel length is greater than 50 nm, the FinFET may be considered as a long channel FinFET. When the channel length ranges from 5 nm to 50 nm, the FinFET may be considered as a short channel FinFET.

As shown in FIG. 1J, in one embodiment, the gate 122 and the gate dielectric layer 112 underneath are considered as a gate stack GS, the dielectric structure DS (e.g., the pair of spacers 116 or the combination of the pair of spacers 116 and the patterned dielectric layer 118) is formed on sidewalls of the gate stack GS, and the top surface of the dielectric structure DS is substantially coplanar with a top surface of the gate stack GS.

Figure 1K:
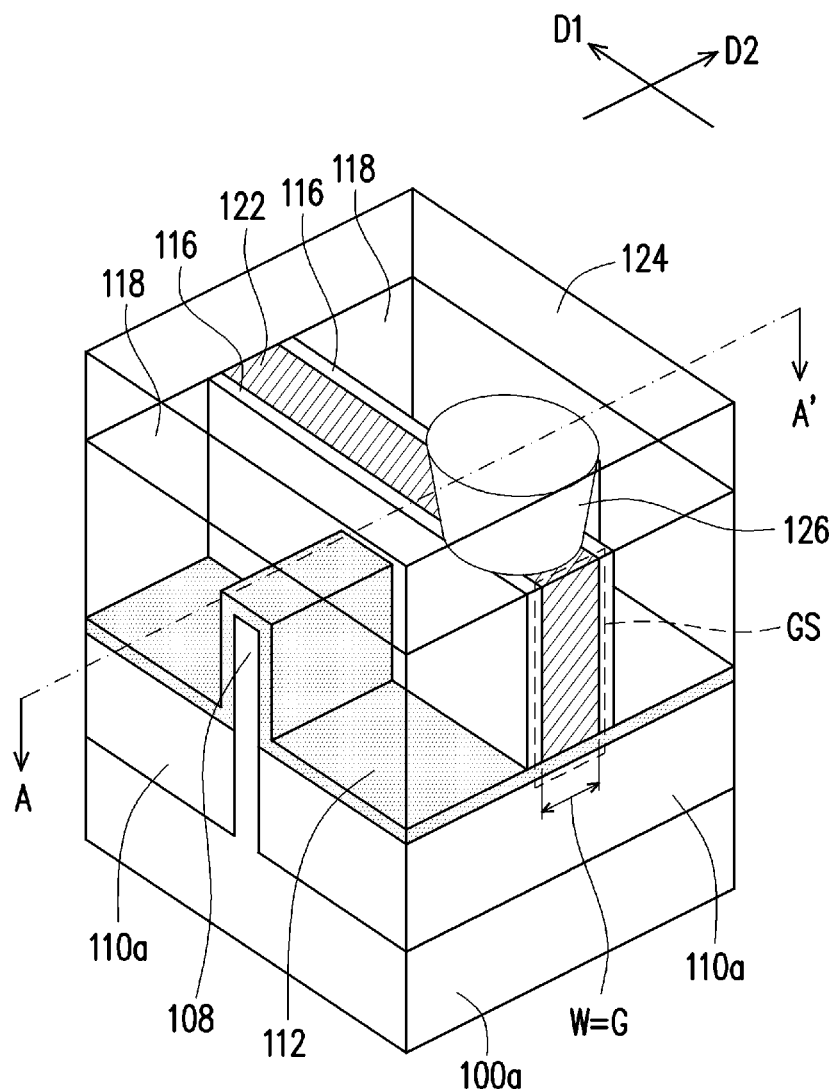

FIG. 1K is a perspective view of the semiconductor device at one of various stages of the manufacturing method. Referring to FIGS. 1J-1K, after the gate 122 is formed, an interlayer dielectric layer 124 is formed over the top surfaces of the gate stack GS and the dielectric structure DS. The interlayer dielectric layer 124 is patterned to form a contact via 124a therein. Then, a gate contact 126 is formed in the contact via 124a of the interlayer dielectric layer 124 so as to electrically connect with the gate 122 of the gate stack GS. In some embodiments, the interlayer dielectric layer 124 may include silicon oxide, silicon nitride, silicon oxynitride, a spin-on dielectric material, or a low-K dielectric material. The interlayer dielectric layer 124 may be formed by high-density-plasma chemical vapor deposition (HDP-CVD), sub-atmospheric CVD (SACVD) or by spin-on. The interlayer dielectric layer 124 is patterned by photolithography and etch process so as to form at least one contact via 124a therein, for example.

Figure 2A:
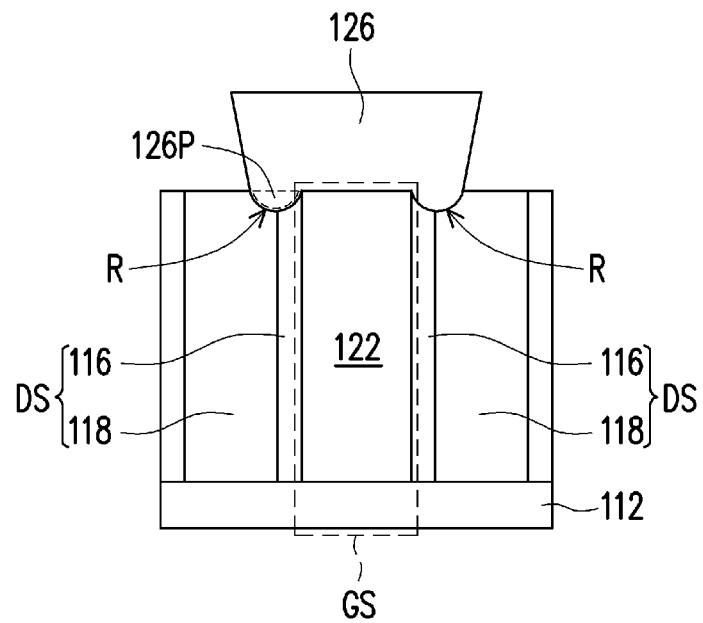
FIGS. 2A-2F are cross-sectional views of a semiconductor device in accordance with some embodiments.
Figure 2B:
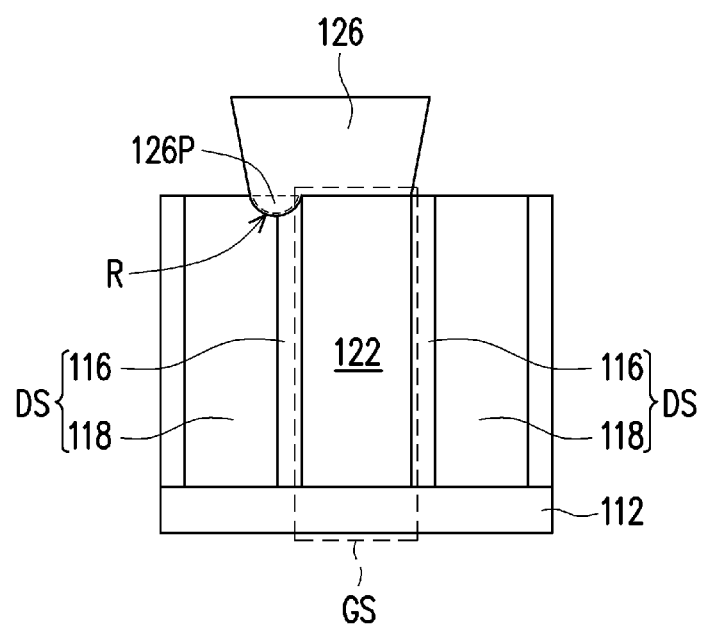

FIG. 2A-2F illustrate cross-sectional views of a semiconductor device along a cross-section A-A' in FIG. 1K. Referring to FIG. 1K, FIG. 2A and FIG. 2B, during the patterning process of the interlayer dielectric layer 124 (as shown in FIG. 1K), portion of the dielectric structure DS near the gate stack GS is partially removed and at least one recess R is formed. The gate contact 126 is then formed to cover the gate stack GS and the at least one recess R in the dielectric structure DS, wherein a bottom dimension (e.g., bottom width) of the gate contact 126 is greater than a top dimension (e.g., top width) of the gate stack GS. In some embodiments, the gate contact 126 comprises at least one protrusion 126P embedded in the at least one recess R of the dielectric structure DS. In other words, the protrusion 126P of the gate contact 126 extends into the dielectric structure DS and is electrically connected to the gate stack GS.

As shown in FIG. 2A, the gate contact 126 is aligned with the gate stack GS precisely and two recesses R (i.e. a first recess and a second recess) located at two opposite sides of the gate stack GS are formed in the dielectric structure DS. In this case, the gate contact 126 comprises two protrusions 124P (i.e. a first protrusion and a second protrusion) embedded in the recesses R. For example, each of the recesses R is formed in one of the spacers 116 and the patterned dielectric layer 118. In other words, the recesses R comprise a first spacer recess and a second recess formed in the pair of spacers 116. Furthermore, the recesses R comprise a first dielectric recess a second dielectric recess formed in the patterned dielectric layer 118, wherein each of the spacer recesses (i.e. first and second spacer recesses) and one of the dielectric recesses (i.e. first and second dielectric recesses) are connected correspondingly so as to formed the recess R. In some alternative embodiments, the recesses R are formed merely in the pair of spacers 116. In other words, the spacer recesses constitute the recesses R.

In some alternative embodiments, as shown in FIG. 2B, the gate contact 126 is slightly misaligned with the gate stack GS and one recess R located at one side of the gate stack GS is formed in the dielectric structure DS. In this case, the gate contact 126 comprises one protrusion 126P embedded in the recess R. For example, the recess R constituted by the spacer recess only or the combination of the spacer recess and the dielectric recess.

Figure 2C:
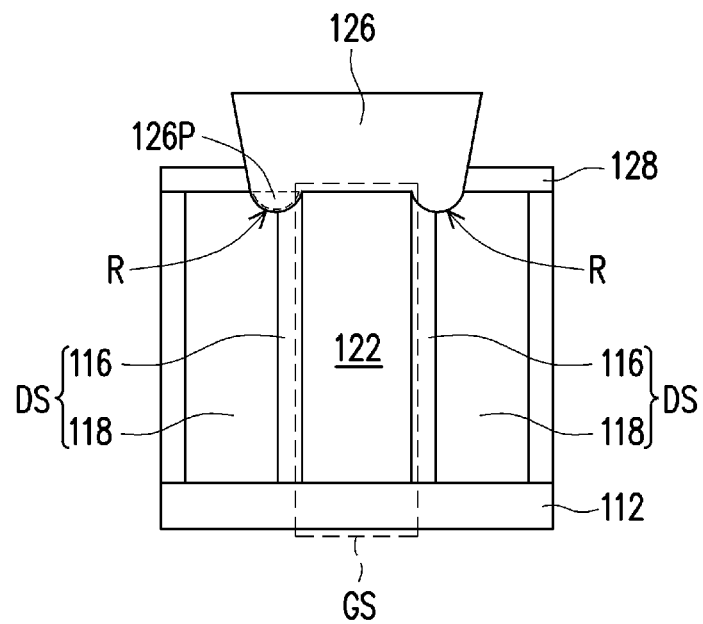
Figure 2D:
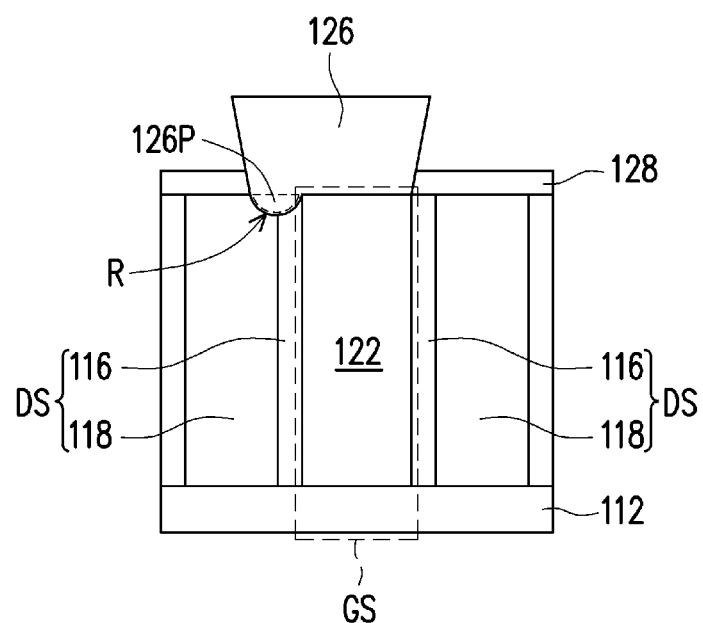

Referring to FIG. 2C and FIG. 2D, the dielectric structure DS is further covered by a cap layer 128. In some embodiments, the cap layer 128 is a silicon nitride layer formed, for example, by low-pressure chemical vapor deposition (LP-CVD) or plasma enhanced chemical vapor deposition (PECVD). The cap layer 128 protects the gate stack GS from damaging during sequentially performed source/drain contact process. In addition, the cap layer 128 facilitates self-alignment between the source/drain contacts and the semiconductor fin.

In FIG. 2A through FIG. 2D, the top surface of the dielectric structure DS is substantially coplanar with the top surface of the gate stack GS. The gate contact 126 having larger dimension (e.g., width) may align with the gate stack SG easily and improve Resistive-Capacitive (RC) delay. In some embodiments, the gate stack GS may be modified properly, as shown in FIG. 2F and FIG. 2F.

Figure 2E:
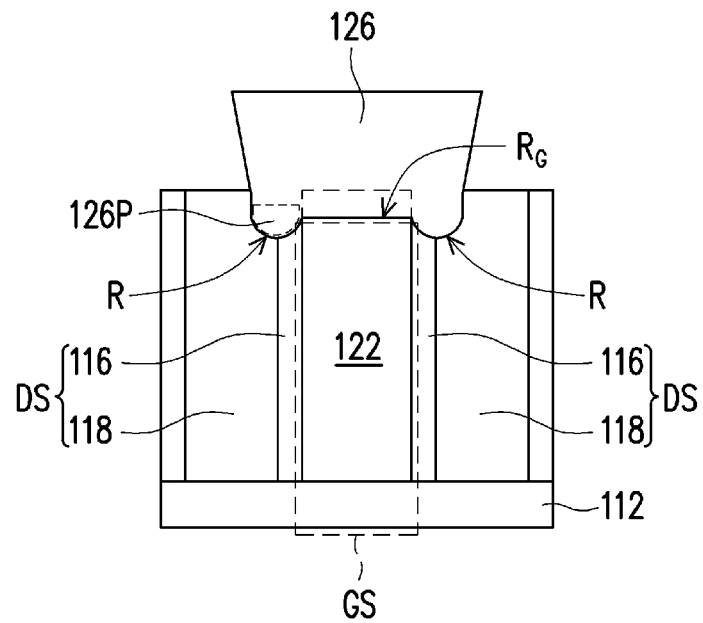
Figure 2F:
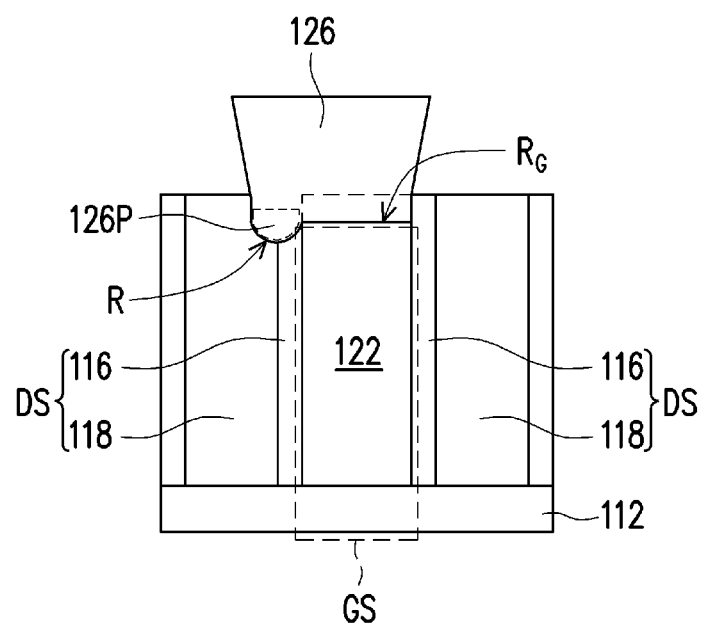

Referring to FIG. 2E and FIG. 2F, the top surface of the gate stack GS is lower than the top surface of the dielectric structure DS, in other words, the gate stack GS comprises a gate recess $R_G$, and the gate contact 126 is partially embedded in the gate recess $R_G$ and the at least one recess R. As shown in FIG. 2E, the gate contact 126 is aligned with the gate stack GS having gate recess $R_G$ precisely and two recesses R (i.e. a first recess and a second recess) located at two opposite sides of the gate stack GS are formed in the dielectric structure DS. In this case, the gate contact 126 comprises two protrusions 124P (i.e. a first protrusion and a second protrusion) embedded in the recesses R. In some alternative embodiments, as shown in FIG. 2F, the gate contact 126 is slightly misaligned with the gate stack GS with gate recess $R_G$ and one recess R located at one side of the gate stack GS is formed in the dielectric structure DS. In this case, the gate contact 126 comprises one protrusion 126P embedded in the recess R.

In the above-mentioned FinFET, since the gate contact 126 has relative greater dimension (e.g., width), the gate contact 126 may align with the gate stack SG easily and improve Resistive-Capacitive (RC) delay. Accordingly, process window of gate contact process is enlarged. Therefore, yield and reliability of the FinFET are enhanced.

In accordance with some embodiments of the present disclosure, a FinFET comprising a substrate, a plurality of insulators, a gate stack, a pair of spacers and a gate contact is provided. The substrate comprises a plurality of trenches and at least one semiconductor fin between the trenches. The insulators are disposed in the trenches. The pair of spacers are disposed on two opposite sidewalls of the gate stack. The gate stack and the pair of spacers cover the semiconductor fin and the insulators. The gate contact is electrically connected to the gate stack. The gate contact extends into at least one spacer among the pair of spacers, and a bottom dimension of the gate contact is greater than a top dimension of the gate stack.

In accordance with alternative embodiments of the present disclosure, a FinFET comprising a substrate, a plurality of insulators, a gate stack, a pair of spacers and a gate contact is provided. The substrate comprises a plurality of trenches and at least one semiconductor fin between the trenches. The insulators are disposed in the trenches. The pair of spacers are disposed on two opposite sidewalls of the gate stack. The gate stack and the pair of spacers cover the semiconductor fin and the insulators. The gate contact is electrically connected to the gate stack. At least one depressed and curved interface is between the gate contact and at least one spacer among the pair of spacers, and a bottom dimension of the gate contact is greater than a top dimension of the gate stack.

In accordance with yet alternative embodiments of the present disclosure, a FinFET comprising a substrate, a plurality of insulators, a gate stack, a dielectric structure and a gate contact is provided. The substrate comprises a plurality of trenches and at least one semiconductor fin between the trenches. The insulators are disposed in the trenches. The dielectric structure is disposed on sidewalls of the gate stack. The gate stack and the dielectric structure cover the semiconductor fin and the insulators. The dielectric structure includes at least one depressed contact surface. The gate contact is electrically connected to the gate stack. The gate contact covers the at least one depressed contact surface of dielectric structure, and bottom width of the gate contact is greater than a top width of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
 a substrate comprising a semiconductor fin;
 an insulator disposed on the substrate, the semiconductor fin protruding from the insulator;
 a gate stack disposed on the substrate and wrapping a portion of the semiconductor fin;
 spacers disposed on opposite sidewalls of the gate stack; and
 a gate contact electrically connected to the gate stack, the gate contact extending into at least one spacer among the spacers, wherein the gate contact comprises at least one protrusion protruding, and at least one spacer among the spacers comprises a concave and curved surface in contact with the at least one protrusion.

2. The semiconductor structure of claim 1, wherein at least one depressed and curved contact interface is between the at least one protrusion of the gate contact and the concave and curved surface of the at least one spacer.

3. The semiconductor structure of claim 1, wherein the spacers comprises a first spacer comprising a first concave and curved contact surface and a second spacer comprising a second concave and curved contact surface, the first spacer and the second spacer are disposed on the opposite sidewalls of the gate stack, and the gate contact comprises a first protrusion in contact with the first concave and curved contact surface of the first spacer and a second protrusion in contact with the second concave and curved contact surface of the second spacer.

4. The semiconductor structure of claim 1 further comprising a patterned dielectric layer disposed over the substrate, wherein a top surface of the gate stack is lower than a top surface of the patterned dielectric layer.

5. The semiconductor structure of claim 1 further comprising a patterned dielectric layer disposed over the substrate, wherein a top surface of the patterned dielectric layer is substantially coplanar with a top surface of the gate stack.

6. The semiconductor structure of claim 5 further comprising:
 a cap layer covering the top surface of the patterned dielectric layer.

7. The semiconductor structure of claim 1, wherein the gate stack comprises a single gate stack, the gate contact electrically contacting the single gate stack, and a bottom width of the gate contact is greater than a width of the single gate stack.

8. A semiconductor structure, comprising:
 a substrate comprising a semiconductor fin;
 an insulator disposed on the substrate, the semiconductor fin protruding from the insulator;
 a gate stack disposed on the substrate and wrapping a portion of the semiconductor fin;
 spacers disposed on opposite sidewalls of the gate stack; and
 a gate contact disposed on and electrically connected to the gate stack, at least one depressed and curved interface being between the gate contact and at least one spacer among the spacers, wherein the gate contact comprises at least one protrusion protruding, at least one spacer among the spacers comprises a concave and curved surface in contact with the at least one protrusion, and the at least one depressed and curved contact interface is between the at least one protrusion of the gate contact and the concave and curved surface of the at least one spacer.

9. The semiconductor structure of claim 8, wherein the spacers comprises a first spacer and a second spacer disposed on the opposite sidewalls of the gate stack, the gate contact comprises a first protrusion and a second protrusion, a first depressed and curved contact interface is between the first spacer and the first protrusion of the gate contact, and a second depressed and curved contact interface is between the second spacer and the second protrusion of the gate contact.

10. The semiconductor structure of claim 8 further comprising a patterned dielectric layer disposed over the substrate, wherein a top surface of the gate stack is lower than a top surface of the patterned dielectric layer.

11. The semiconductor structure of claim 8 further comprising a patterned dielectric layer disposed over the substrate, wherein a top surface of the patterned dielectric layer is substantially coplanar with a top surface of the gate stack.

12. The semiconductor structure of claim 11 further comprising:
a cap layer covering the top surface of the patterned dielectric layer.

13. The semiconductor structure of claim 8, wherein the gate stack comprises a single gate stack, the gate contact electrically contacting the single gate stack, and a bottom width of the gate contact is greater than a width of the single gate stack.

14. A semiconductor structure, comprising:
a substrate comprising a semiconductor fin;
an insulator disposed on the substrate, the semiconductor fin protruding from the insulator;
a dielectric structure disposed over the semiconductor fin, the dielectric structure comprising a pair of spacers;
a single gate stack between the pair of spacers, the single gate stack wrapping a portion of the semiconductor fin, at least one spacer among the pair of spacers comprising at least one concave and curved contact surface; and
a gate contact electrically contacting the single gate stack, the gate contact consisting of a first contact portion in contact with the single gate stack and a second contact portion extending into the at least one spacer among the pair of spacers and in contact with the at least one concave and curved contact surface.

15. The semiconductor structure of claim 14, wherein the second contact portion of the gate contact comprises at least one protrusion in contact with the at least one concave and curved contact surface of the dielectric structure.

16. The semiconductor structure of claim 14, wherein the dielectric structure further comprises a patterned dielectric layer, and the patterned dielectric layer and the single gate stack are spaced apart by the spacers.

17. The semiconductor structure of claim 16, wherein the second contact portion of the gate contact comprises at least one protrusion protruding into the at least one spacer among the pair of spacers, and the at least one protrusion is in contact with the at least one concave and curved contact surface.

18. The semiconductor structure of claim 16, wherein a bottom width of the gate contact is greater than a width of the single gate stack.

19. The semiconductor structure of claim 14 further comprising a cap layer covering the top surface of the patterned dielectric layer.

* * * * *